(12) United States Patent
Khathuria

(10) Patent No.: US 6,455,333 B1
(45) Date of Patent: Sep. 24, 2002

(54) METHOD OF ACHIEVING STABLE DEEP ULTRAVIOLET (DUV) RESIST ETCH RATE FOR GATE CRITICAL DIMENSION (CD)

(75) Inventor: Ashok M. Khathuria, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/796,382

(22) Filed: Feb. 28, 2001

(51) Int. Cl.$^7$ ................................................ H01L 21/00
(52) U.S. Cl. ................ 438/9; 216/41; 216/79; 438/719; 438/725
(58) Field of Search ................ 438/8, 9, 719, 438/724, 725; 216/41, 49, 67, 79; 430/313, 317

(56) References Cited

U.S. PATENT DOCUMENTS 6,121,155 A * 9/2000 Yang et al. ................ 438/725
6,270,929 B1 * 8/2001 Lyons et al. ............ 438/725 X
6,271,154 B1 * 8/2001 Shen et al. ............ 438/725 X \* cited by examiner

*Primary Examiner*—William A. Powell
(74) *Attorney, Agent, or Firm*—LaRiviere, Grubman & Payne, LLP

(57) ABSTRACT

A method of stabilizing the DUV resist etch rate for a gate critical dimension, especially for a CD$\leq$75 $\mu$m. More specifically, the present invention provides a method for stabilizing a deep ultraviolet (DUV) resist etch rate by utilizing the directly proportionate relationship between the lateral erosion and a vertical etch rate. The present invention method provides control of lateral erosion of the DUV resist by measuring the vertical etch rate component. The present invention method involves conditioning (seasoning) an etch chamber with a conditioning wafer having a unique stack which results in consistent and stable DUV resist etch rates. The present invention seasoning is applied before processing of a product wafer lot for providing better control of the gate CD targeting, and thereby eliminating a "first wafer" effect.

16 Claims, 6 Drawing Sheets

After SiON and Poly Main Overetch

After SiON and Poly Main Overetch

—— Initial Profile (DI)
---- After Resist trim

| Date | Time | Pre-Cond. Etch Rate (e.r.) | Avg Pre-Cond. Etch Rate (e.r.) | Avg Diff In Etch Rate (e.r.) | Avg Etch Rate (e.r.) | Unif'd Etch Rate (e.r.) | Std Etch Rate (e.r.) | Comments | # Seasoning Iterations |
|---|---|---|---|---|---|---|---|---|---|
| 02/28/2000 | 10:54:00 | 7155 | 5204 | 1950.9 | 1950.9 | 3.66 | 2.16 | CS68-poly seasoning | 3 |
| 02/28/2000 | 10:51:13 | 7153 | 5203 | 1950.2 | 1950.2 | 3.9 | 2.22 | CS68-poly seasoning | 2 |
| 02/28/2000 | 10:48:32 | 7152 | 5208 | 1944 | 1944 | 3.88 | 2.28 | CS68-poly seasoning | 1 |
| 02/28/2000 | 10:45:42 | 7151 | 5860 | 1290.8 | 1290.8 | 6.74 | 4.71 | after HGS, no seasoning | 0 |
| 02/25/2000 | 17:36:25 | 7168 | 5225 | 1942.2 | 1942.2 | 4.69 | 2.65 | addl wafer lot C005260 | 1 |
| 02/25/2000 | 17:34:09 | 7158 | 5217 | 1940.4 | 1940.4 | 4.07 | 2.35 | 2 wafers lot C005260 | 2 |
| 02/25/2000 | 17:30:51 | 7167 | 5217 | 1950.7 | 1950.7 | 4.02 | 2.44 | 2 profile wafers, HIP6L-PC | 2 |
| 02/25/2000 | 16:26:10 | 7124 | 5726 | 1397.9 | 1397.9 | 7.05 | 4.58 | after std PC test, 07 7299 | ? |
| 02/25/2000 | 12:39:44 | 7127 | 5158 | 1969.4 | 1969.4 | 5.58 | 2.29 | after prior wafers etched w/o seasoning | 0 |
| 02/25/2000 | 9:58:43 | 7138 | 5137 | 2001 | 2001 | 5.12 | 3.22 | In sequence w/prior e. r. after 2 wfrs lot C0055260 w/HIP6L-poly | 2 |
| 02/25/2000 | 9:53:30 | 7139 | 5995 | 1143.8 | 1143.8 | 5.25 | 3.72 | 3 resist wfrs seasoning w/PC formulation before e. r. | 3 |
| 02/25/2000 | 9:04:25 | 7135 | 5701 | 1434.1 | 1434.1 | 5.79 | 3.96 | 2 prof. wfrs w/new cond. form., resist e. r. using CS68 DUV form. | ? |

Table 1

Figure 2b

METHOD OF ACHIEVING STABLE DEEP ULTRAVIOLET (DUV) RESIST ETCH RATE FOR GATE CRITICAL DIMENSION (CD)

FIELD OF THE INVENTION

The present invention relates to small high density semiconductor devices. More particularly, the present invention relates to photoresist etching methods in the fabrication of semiconductor devices. Even more particularly, the present invention relates to stabilizing the a deep ultraviolet photoresist (hereinafter "resist") etch rate for a gate critical dimension (hereinafter "CD") of a semiconductor device.

BACKGROUND OF THE INVENTION

Currently, the need for high performance devices and low manufacturing cost has driven the semiconductor industry to higher density and smaller devices. In order to achieve the high density, the gate length of less than 100 nm is required. To cost-effectively achieve such gate lengths using current lithographic techniques is difficult, prompting the development of alternative methods. One such method of achieving smaller final CDs comprises lateral eroding of only a DUV resist before etching the gate material. This etch process involves several parameters (e.g., chemistry, system design, ion density, system pressure). Ion density is a function of applied power while the system pressure affects the mean free path of the ions. System pressures typically range from 0.4 mTorr to 50 mTorr while etch rates typically range from 600 Å/min to 2000 Å/min.[1] This method has been shown to be effective in minimizing the gate length to not less than 75 nm in a device; however, this DUV resist etch rate is found to be unstable and results in poor CD control. Due to cost concerns, the related art methods may involve seasoning a chamber with used polysilicon-only test wafers or resist-only coated wafers. This related art seasoning method provides only low and erratic resist etch rates which produces inconsistently etched layers, especially with respect to resist layers, in product wafers. Thus, wide spread etch rates lead to the related art problem of etch rate inconsistency. Therefore, a need exists for a method of stabilizing the DUV resist etch rate for a gate CD.

[1] Peter Van Zant, Microchip Fabrication—A Practical Guide to Semiconductor Processing 3$^{rd}$ Ed., pp. 268–269 (1997).

BRIEF SUMMARY OF THE INVENTION

Accordingly, the present invention provides a method of stabilizing the DUV resist etch rate for a gate CD of ≦75 μm. More specifically, the present invention provides a method for stabilizing lateral erosion rate of the DUV resist by utilizing the directly proportionate relationship between the lateral erosion rate and a vertical etch rate:

$$R_L = kR_V,$$

where $R_L$ is the lateral erosion rate (i.e., trim rate) of the resist, $R_V$ is the vertical resist etch rate, and k is, therefore, a constant defined by the ratio of the trim rate to the vertical resist etch rate for any given set of photoresist and etchant combinations and conditions. Since measuring the lateral erosion is difficult, the present invention method provides better control of the DUV resist etch rate by measuring the vertical etch rate component. The present invention method involves a unique conditioning (i.e., seasoning) procedure using a distinct formulation in a decoupled plasma source (DPS) polysilicon etch chamber which results in consistent and stable DUV resist etch rates. The present invention seasoning is applied before processing of the wafer lot for providing better control of the gate CD targeting, and thereby possibly eliminating a "first wafer" effect.

In general, the present invention method of stabilizing a resist etch rate for at least one product wafer having at least one gate, comprises: (a) conditioning an etch chamber with a volatilized polymeric material, and thereby reducing etch chamber wall effects on an etchant; (b) providing a pilot wafer; (c) etching the pilot wafer in the etch chamber using the etchant, in accordance with a given etching technique; (d) verifying an optimum etch chamber conditioning, and if the optimum etch chamber conditioning is acceptable, proceeding to step (e), otherwise reconditioning the etch chamber by returning to step (a); (e) providing the at least one product wafer; and (f) etching the at least one product wafer in the etch chamber using the etchant, in accordance with the given etching technique.

BRIEF DESCRIPTION OF THE DRAWING(S)

For a better understanding of the present invention, reference is made to the below referenced accompanying drawings.

Figure 1B:
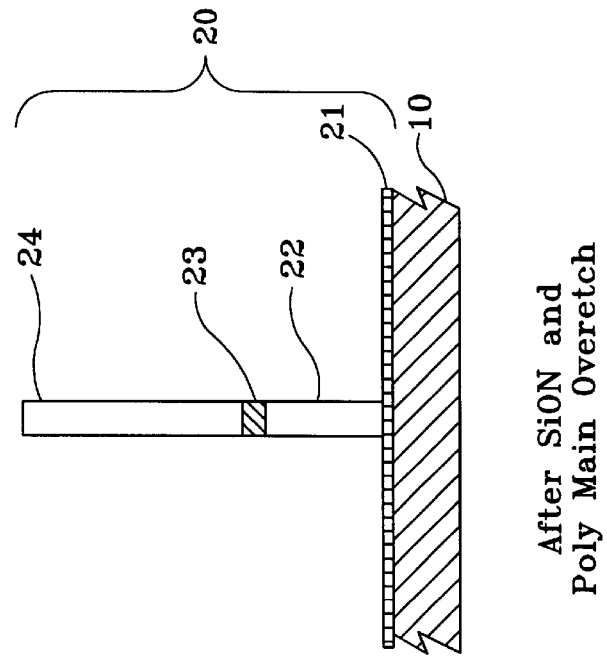
FIG. 1b is a cross-sectional view of a conditioning wafer, having a stack comprising a gate oxide layer, a polysilicon layer, a dielectric layer comprising a material such as silicon oxynitride or a silicon nitride, and a resist layer such as a DUV photoresist layer, after etching, in accordance with the present invention.
Figure 1A:
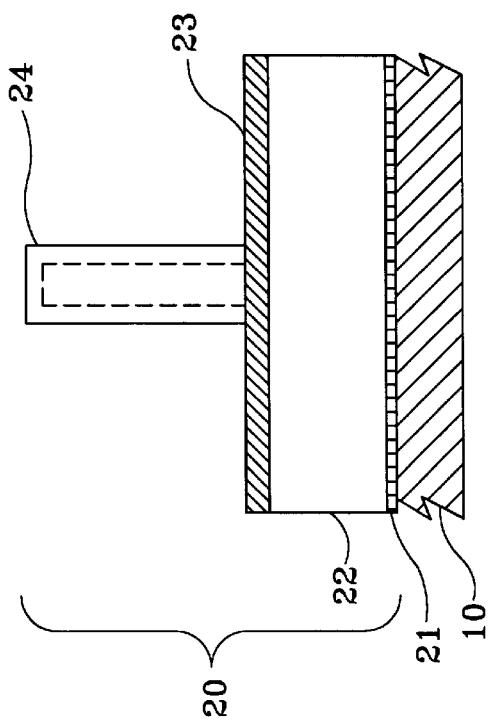
FIG. 1a is a cross-sectional view of a conditioning wafer, having a stack comprising a gate oxide layer, a polysilicon layer, a dielectric layer comprising a material such as silicon oxynitride or a silicon nitride, and a resist layer such as a DUV photoresist layer, before etching, in accordance with the present invention.
Figure 1C:
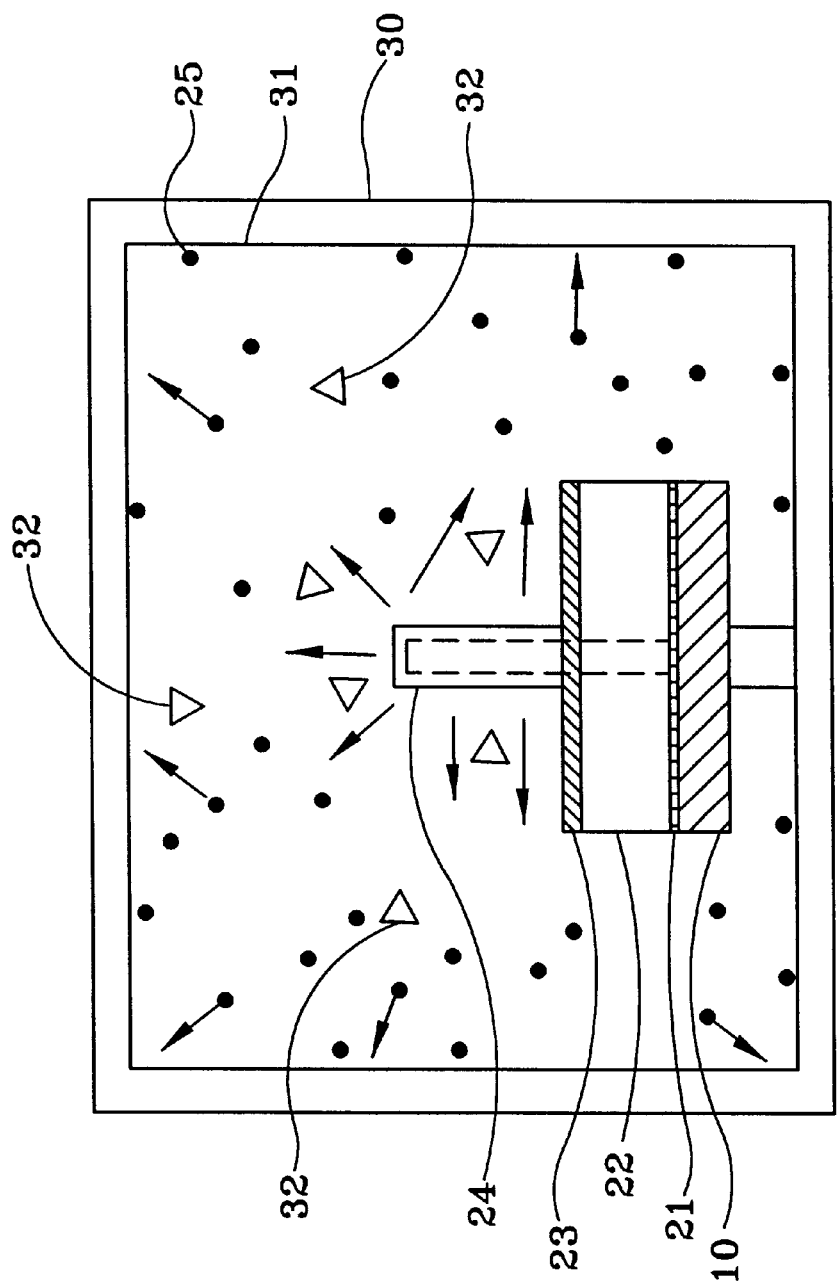

FIG. 1c is a cross-sectional view of at least one conditioning wafer, having a stack comprising a gate oxide layer, a polysilicon layer, a dielectric layer comprising a material such as silicon oxynitride or a silicon nitride, and a resist layer such as a DUV photoresist layer in an etch chamber being etched, thereby volatilizing a polymeric material for deposition onto the etch chamber wall, in accordance with the present invention.

Figure 1D:
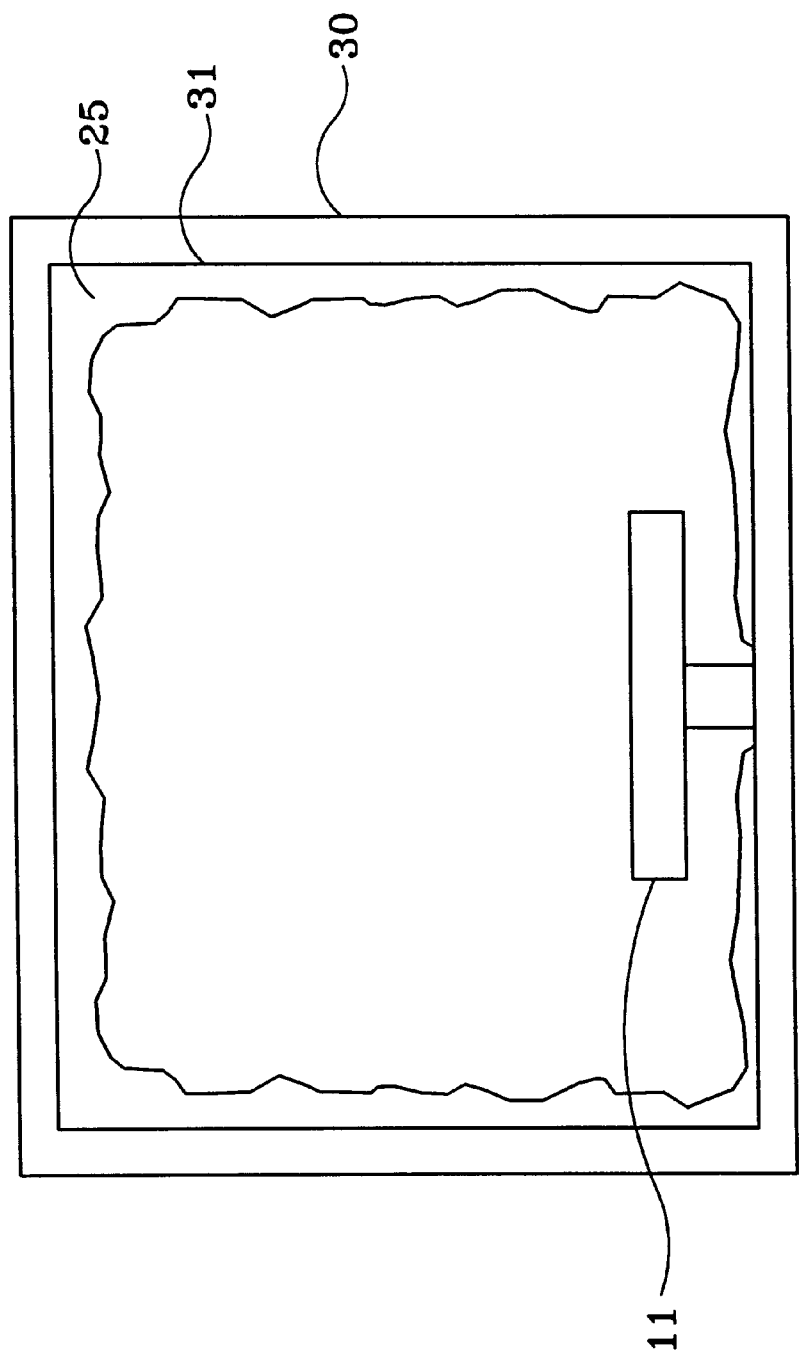

FIG. 1d is a cross-sectional view of a pilot wafer in an etch chamber having a volatilized polymeric material deposited on the etch chamber wall, in accordance with the present invention.

Figure 2A:
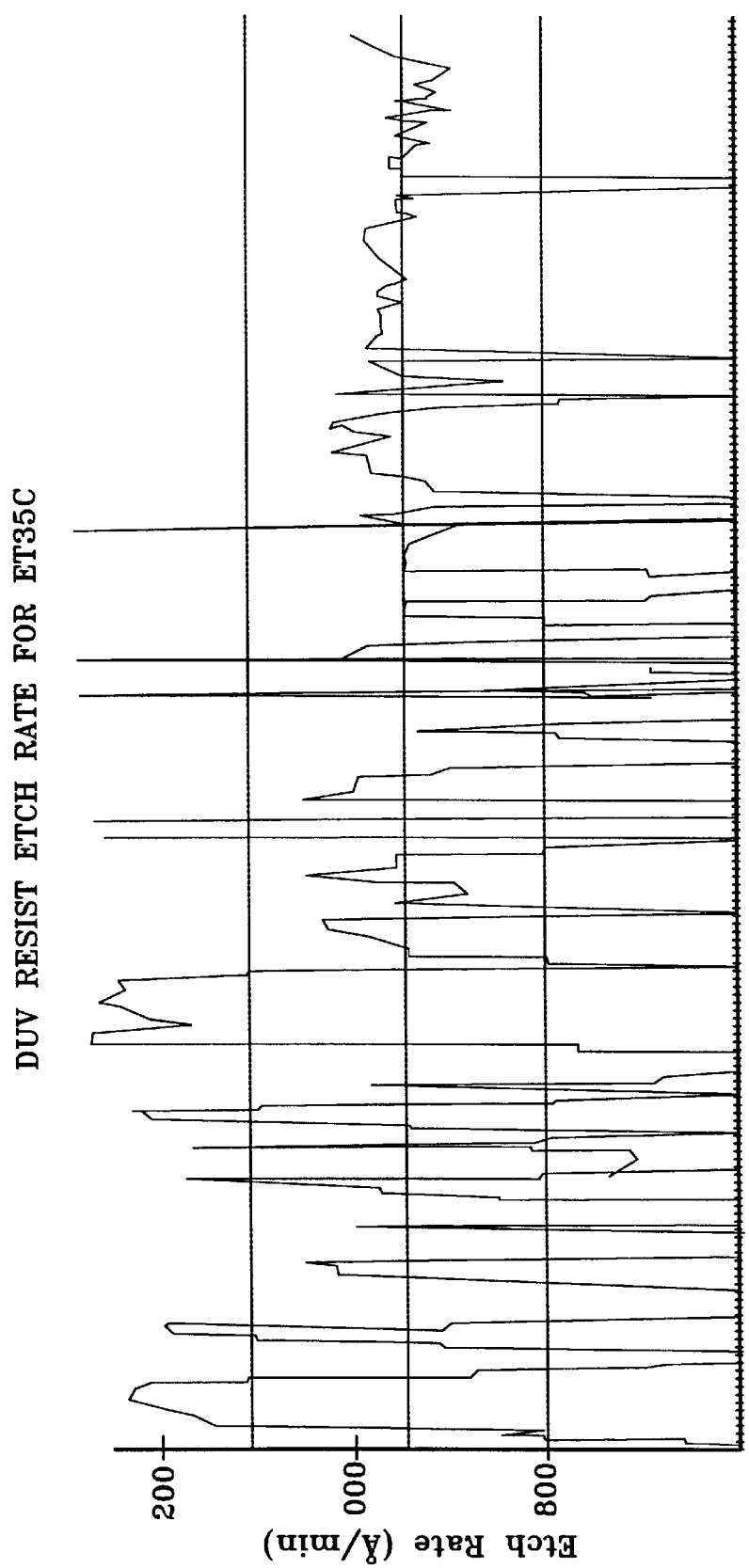

FIG. 2a is a graph of the comparative DUV resist etch rate (Å/min) of a pilot wafer in terms of a date time-line before and after implementation of a conditioning wafer, in accordance with the present invention.

FIG. 2b comprises Table 1 which displays test data corresponding to the graph of FIG. 2, in accordance with the present invention.

Figure 3:
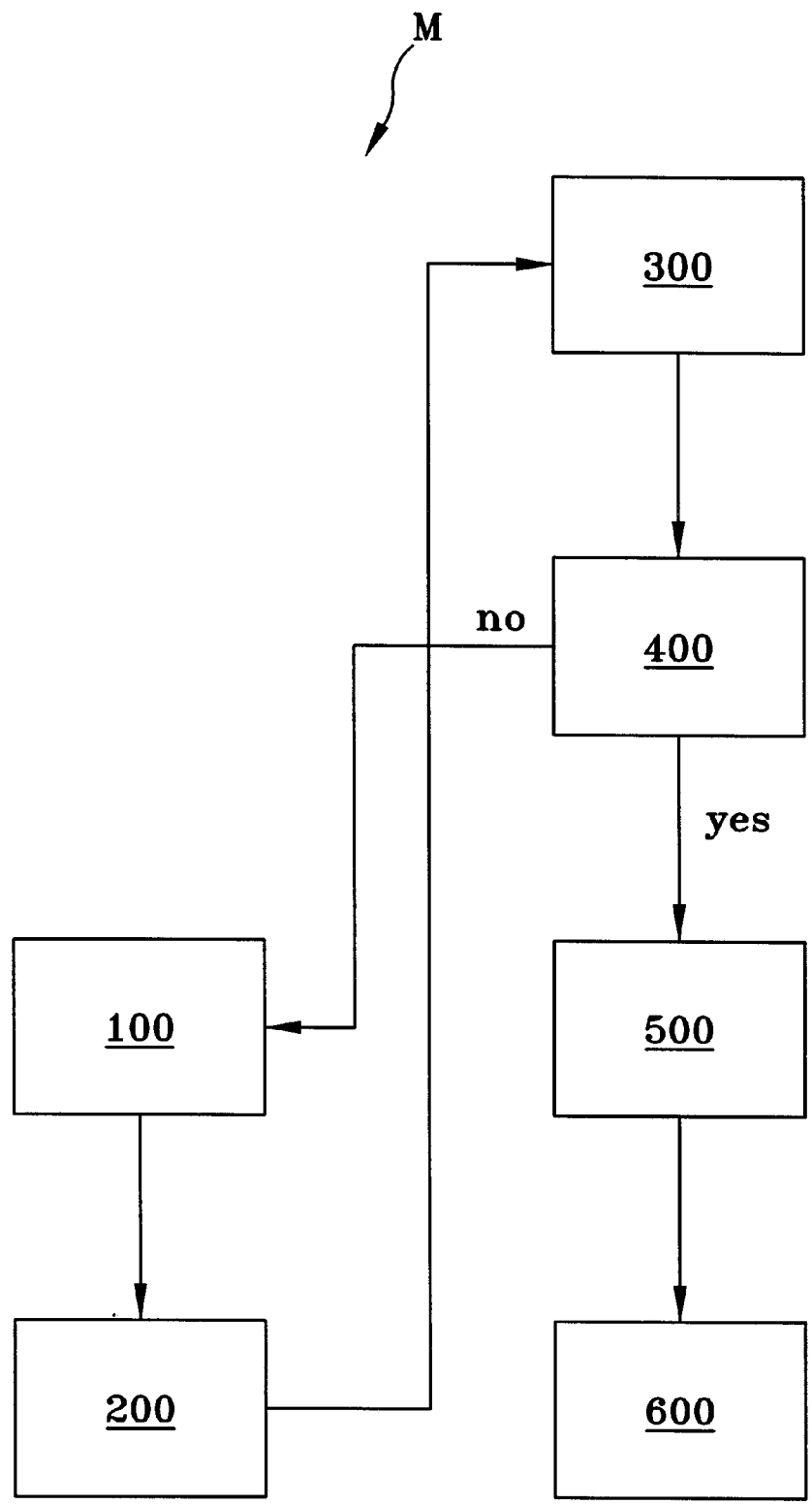

FIG. 3 is flowchart of the method of stabilizing the DUV resist etch rate for a gate CD, in accordance with the present invention.

Reference numbers refer to the same or equivalent parts of the present invention throughout the several figures of the drawings.

DETAILED DESCRIPTION OF THE INVENTION

FIG. 1a is a cross-sectional view of a conditioning wafer 10, having a stack 20 comprising a gate oxide layer 21, a polysilicon layer 22, a dielectric layer 23 comprising at least one material selected from a group consisting essentially of a silicon oxynitride (SiON) or a silicon nitride ($Si_xN_y$, preferably silicon-rich silicon nitride, i.e., $Si_{3+n}N_4$), and a resist layer 24 such as a DUV photoresist layer, before etching, in accordance with the present invention.

FIG. 1b is a cross-sectional view of a conditioning wafer 10, having a stack 20 comprising a gate oxide layer 21, a polysilicon layer 22, a dielectric layer 23 comprising at least one material selected from a group consisting essentially of a silicon oxynitride (SiON) or a silicon nitride ($Si_xN_y$, preferably silicon-rich silicon nitride, i.e., $Si_{3+n}N_4$), and a resist layer 24 such as a DUV photoresist layer, after etching, in accordance with the present invention.

FIG. 1c is a cross-sectional view of at least one conditioning wafer 10, having a stack 20 comprising a gate oxide layer 21, a polysilicon layer 22, a dielectric layer 23 comprising at least one material selected from a group consisting essentially of a silicon oxynitride (SiON) or a silicon nitride ($Si_xN_y$, preferably silicon-rich silicon nitride, i.e., $Si_{3+n}N_4$), and a resist layer 24 such as a DUV photoresist layer in an etch chamber 30 being etched by an etchant 32, thereby volatilizing a polymeric material 25 for deposition onto the etch chamber wall 31, in accordance with the present invention.

FIG. 1d is a cross-sectional view of a pilot wafer 11 in the etch chamber 30 having the volatilized polymeric material 25 deposited on the etch chamber wall 31, in accordance with the present invention. The volatilized polymeric material 25 may comprise some material emanating from the resist layer; and some material emanating from at least one layer selected from a group consisting essentially of the dielectric layer, the polysilicon layer, and the gate oxide layer.

FIG. 2a is a graph of the comparative DUV resist etch rate (Å/min) of a pilot wafer 11 in terms of a date time-line before and after implementation of a conditioning wafer 10, in accordance with the present invention.

FIG. 2b comprises Table 1 which displays test data corresponding to the graph of FIG. 2, in accordance with the present invention. FIG. 2b tabulates a group of parameters which include average preconditioning etch rate, average post-conditioning etch rate, average etch rate change Δ, average etch rate, unified etch rate, and standard etch rate as a function of date and time as well as conditioning formulation and conditioning iterations.

FIG. 3 flowcharts a method M of stabilizing a resist etch rate for at least one product wafer having at least one gate, in accordance with the present invention, comprising: (a) conditioning an etch chamber 30 with a volatilized polymeric material 25, and thereby reducing etch chamber wall effects on an etchant 32, as indicated by block 100; (b) providing a pilot wafer 11, as indicated by block 200; (c) etching the pilot wafer 11 in the etch chamber 30 using the etchant 32, in accordance with a given etching technique, as indicated by block 300; (d) verifying an optimum etch chamber conditioning, and if the optimum etch chamber conditioning is acceptable, proceeding to step (e), otherwise reconditioning the etch chamber 30 by returning to step (a), as indicated by block 400; (e) providing the at least one product wafer 12, as indicated by block 500; and (f) etching the at least one product wafer 12 in the etch chamber 30 using the etchant 32, in accordance with the given etching technique, as indicated by block 600, wherein said step (a) may comprise: (1) providing at least one stacked conditioning wafer 10 having a stack 20; (2) placing the at least one stacked conditioning wafer 10 in the etch chamber 30; and (3) etching the at least one stacked conditioning wafer 10 in the etch chamber 30 using an etchant 32, in accordance with the given etching technique, thereby volatilizing the stack 20, thereby forming the volatilized polymeric material 25, and thereby depositing the volatilized polymeric material 25 on a wall 31 of the etch chamber 30, wherein said step (d) may comprise measuring a vertical resist etch rate of the pilot wafer 11, wherein the stack 20 may comprise: a gate oxide layer 21; a polysilicon layer 22; a dielectric layer 23 comprising at least one material selected from a group consisting essentially of a silicon oxynitride (SiON) or a silicon nitride ($Si_xN_y$, preferably silicon-rich silicon nitride, i.e., $Si_{3+n}N_4$); and a resist layer 24, wherein the volatilized polymeric material 25 comprises: some material emanating from the resist layer 24; and some material emanating from at least one layer selected from a group consisting essentially of the dielectric layer 23, the polysilicon layer 22, and the gate oxide layer 21, wherein the resist layer 24 may comprise a deep ultraviolet (DUV) photoresist, wherein the optimum etch chamber conditioning may comprise: a consistent resist etch rate; and a reliable gate critical dimension (CD), wherein the etch chamber 30 may comprise a decoupled plasma source (DPS) polysilicon etch chamber, wherein the at least one gate may have a length in the range of less than 75 nm, wherein the etchant 32 may comprise at least one material selected from a group consisting essentially of chlorine (Cl), hydrogen bromide (HBr), oxygen ($O_2$), carbon tetrafluoride ($CF_4$), helium (He), and argon (Ar), wherein the consistent vertical resist etch rate comprises a differential in a range of ±100 Å/min, and wherein the reliable gate CD variation comprises a differential in a range of ±10 nm. Also, in step (d), the vertical resist etch rate may be measured using the relationship discussed supra: $R_L = kR_V$, where $R_L$ is the lateral erosion rate of the resist, $R_V$ is the vertical resist etch rate, and k is a constant.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:
1. A method of stabilizing a resist etch rate for at least one product wafer having at least one gate, comprising:

(a) conditioning an etch chamber with a volatilized polymeric material, and thereby reducing etch chamber wall effects on an etchant;
(b) providing a pilot wafer;
(c) etching the pilot wafer in the etch chamber using the etchant;
(d) verifying an optimum etch chamber conditioning, and if the optimum etch chamber conditioning is acceptable, proceeding to step (e), otherwise reconditioning the etch chamber by returning to step (a);
(e) providing the at least one product wafer; and
(f) etching the at least one product wafer in the etch chamber using the etchant.

2. A method, as recited in claim 1, wherein said step (a) comprises:
  (1) providing at least one conditioning wafer having a stack;
  (2) placing the at least one stacked conditioning wafer in the etch chamber; and
  (3) etching the at least one stacked conditioning wafer in the etch chamber using
    an etchant,
    thereby volatilizing the stack,
    thereby forming the volatilized polymeric material, and
    thereby depositing the volatilized polymeric material on a wall of the etch chamber.

3. A method, as recited in claim 1, wherein said step (d) comprises measuring a vertical resist etch rate of the pilot wafer.

4. A method, as recited in claim 2, wherein the stack comprises:
  a gate oxide layer;
  a polysilicon layer;
  a dielectric layer; and
  a resist layer.

5. A method, as recited in claim 4, wherein said dielectric layer comprises a material selected from a group consisting essentially of a silicon oxynitride (SiON) and a silicon nitride ($Si_3N_4$).

6. A method, as recited in claim 5, wherein said silicon nitride comprises a silicon-rich silicon nitride ($Si_{3+n}N_4$), where n comprises a number greater than zero.

7. A method, as recited in claim 4, wherein the resist layer comprises a deep ultraviolet (DUV) photoresist.

8. A method, as recited in claim 1, wherein the optimum etch chamber conditioning comprises:
  a consistent vertical resist etch rate; and
  a reliable gate critical dimension (CD) variation.

9. A method, as recited in claim 1, wherein the etch chamber comprises a decoupled plasma source (DPS) polysilicon etch chamber.

10. A method, as recited in claim 1, wherein the at least one gate has a length in the range of $\leq 75$ mn.

11. A method, as recited in claim 1, wherein the etchant comprises at least one material selected from a group consisting essentially of chlorine (Cl), hydrogen bromide (HBr), oxygen ($O_2$), carbon tetrafluoride ($CF_4$), helium (He), and argon (Ar).

12. A method, as recited in claim 8, wherein the consistent vertical resist etch rate comprises a differential in a range of $\pm 100$ Å/min.

13. A method, as recited in claim 8, wherein the reliable gate CD variation comprises a differential in range of $\pm 10$ nm.

14. A method, as recited in claim 4, wherein the volatilized polymeric material comprises:
  some material emanating from the resist layer; and
  some material emanating from at least one layer selected from a group consisting essentially of:
    the dielectric layer,
    the polysilicon layer, and
    the gate oxide layer.

15. A method, as recited in claim 3, wherein measuring the vertical resist etch rate further comprises using the relationship: $R_L = kR_V$, where $R_L$ is the lateral erosion rate of the resist, $R_V$ is the vertical resist etch rate, and k is a constant.

16. A method of stabilizing a resist etch rate for at least one product wafer having at least one gate, comprising:
  (a) conditioning an etch chamber with a volatilized polymeric material, and thereby reducing etch chamber wall effects on an etchant;
  (b) providing a pilot wafer;
  (c) etching the pilot wafer in the etch chamber using the etchant;
  (d) verifying an optimum etch chamber conditioning, and if the optimum etch chamber conditioning is acceptable, proceeding to step (e), otherwise reconditioning the etch chamber by returning to step (a);
  (e) providing the at least one product wafer; and
  (f) etching the at least one product wafer in the etch chamber using the etchant,
  wherein the step (a) comprises:
    (1) providing at least one stacked conditioning wafer having a stack;
    (2) placing the at least one stacked conditioning wafer in the etch chamber; and
    (3) etching the at least one stacked conditioning wafer in the etch chamber using an etchant,
      thereby volatilizing the stack,
      thereby forming a volatilized stack material, and
      thereby depositing the volatilized stack material on a wall of the etch chamber,
  wherein the step (d) comprises measuring a vertical resist etch rate of the pilot wafer,
  wherein measuring the vertical resist etch rate further comprises using the relationship:
    $R_L = kR_V$, where $R_L$ is the lateral erosion rate of the resist, $R_V$ is the vertical resist etch rate, and k is a constant,
  wherein the stack comprises:
    a gate oxide layer;
    a polysilicon layer;
    a dielectric layer; and
    a resist layer,
  wherein said dielectric layer comprises a material selected from a group consisting essentially of a silicon oxynitride (SiON) and a silicon nitride ($Si_3N_4$),
  wherein said silicon nitride comprises a silicon-rich silicon nitride ($Si_{3+n}N_4$), where n comprises a number greater than zero,
  wherein the volatilized polymeric material comprises:
    some material emanating from the resist layer; and
    some material emanating from at least one layer selected from a group consisting essentially of the dielectric layer, the polysilicon layer, and the gate oxide layer,
  wherein the resist layer comprises a deep ultraviolet (DUV) photoresist,
  wherein the optimum etch chamber conditioning comprises:

a consistent vertical resist etch rate; and a reliable gate critical dimension (CD), wherein the etch chamber comprises a decoupled plasma source (DPS) polysilicon etch chamber, wherein the at least one gate has a length in the range of ≦75 nm, wherein the etchant comprises at least one material selected from a group consisting essentially of chlorine (Cl), hydrogen bromide (HBr), oxygen ($O_2$), carbon tetrafluoride ($CF_4$), helium (He), and argon (Ar), wherein the consistent vertical resist etch rate comprises a differential in a range of ±100 Å/min, and wherein the reliable gate CD variation comprises a differential in a range of ±10 nm.

* * * * *